(12) United States Patent
Hsiao et al.

(10) Patent No.: US 7,200,093 B2
(45) Date of Patent: Apr. 3, 2007

(54) METHOD AND RELATED APPARATUS FOR DECODING INFORMATION CARRIED BY WOBBLE SIGNALS

(75) Inventors: Yuan-Kun Hsiao, Taipei Hsien (TW); Luke Wen, Taipei Hsien (TW)

(73) Assignee: Via Optical Solution, Inc., Hsin-Tien, Taipei Hsien (TW)

( * ) Notice: Subject to any disclaimer, the term of this patent is extended or adjusted under 35 U.S.C. 154(b) by 380 days.

(21) Appl. No.: 10/709,021

(22) Filed: Apr. 7, 2004

(65) Prior Publication Data

US 2005/0017772 A1 Jan. 27, 2005

Related U.S. Application Data

(60) Provisional application No. 60/461,578, filed on Apr. 10, 2003.

(51) Int. Cl.
*G11B 5/09* (2006.01)
(52) U.S. Cl. ............... 369/59.19; 369/59.2; 369/59.23; 369/47.48
(58) Field of Classification Search ............... None
See application file for complete search history.

(56) References Cited

U.S. PATENT DOCUMENTS

| | | | |
|---|---|---|---|
| 5,475,666 A | 12/1995 | Ito et al. | |
| 5,689,482 A * | 11/1997 | Iida | 369/30.1 |
| 6,333,902 B1 | 12/2001 | Shim | |
| 6,345,023 B1 | 2/2002 | Fushimi et al. | |
| 6,661,752 B2 | 12/2003 | Eom | |
| 6,891,785 B2 | 5/2005 | Yamamoto et al. | |
| 7,053,919 B2 | 5/2006 | Nagano | |
| 2002/0131347 A1 | 9/2002 | Raaymakers | |
| 2003/0043714 A1 | 3/2003 | Tukeda | |
| 2003/0179665 A1 | 9/2003 | Iwazawa et al. | |
| 2004/0213119 A1* | 10/2004 | Van Vlerken et al. | 369/59.2 |
| 2005/0073923 A1* | 4/2005 | Tobita | 369/47.28 |

FOREIGN PATENT DOCUMENTS

| | | |
|---|---|---|
| CN | 1373474 A | 10/2002 |
| JP | 11-353686 | 12/1999 |

* cited by examiner

*Primary Examiner*—Muhammad Edun
(74) *Attorney, Agent, or Firm*—Winston Hsu

(57) ABSTRACT

An apparatus for generating a wobble clock includes an operation circuit for receiving a wobble signal and counting cycles of an oscillating signal during a cycle of the wobble signal to derive a cycle value and for comparing the cycle value with a preset cycle value to output a first protection signal, and a phase-locked loop circuit connected to the operation circuit for receiving the wobble signal, the wobble clock and the first protection signal, and determining whether the wobble clock is to be synchronized with the wobble signal according to the first protection signal.

19 Claims, 7 Drawing Sheets

METHOD AND RELATED APPARATUS FOR DECODING INFORMATION CARRIED BY WOBBLE SIGNALS

This application claims benefit of 60/461,578 Apr. 10, 2003.

BACKGROUND OF INVENTION

1. Field of the Invention

The present invention relates in general to a wobble clock generator and a related driving method, and more particularly, to a wobble clock generator and a related driving method having a shared oscillating signal utilized to generate a wobble clock and to act as a reference clock for a protective mechanism capable of avoiding interference generated from a phase-modulated wobble signal.

2. Description of the Prior Art

Over the past few years, storage media have rapidly increased in storage capacity due to demand for storing a tremendous amount of information. Of all the various kinds of storage media, optical discs have features of a low-cost, small-size, low-error-rate, long-storage-time, and high-density storage medium and is the most promising dominant storage medium in the future. Generally speaking, optical disc drives are used to read information stored on an optical disc. Examples of optical disc drives are known as compact disc drives (CD-ROM drives) and digital versatile disc drives (DVD-ROM drives) in the prior art. Some optical disc drives have the additional capability of being able to write data onto an optical disc, i.e., CD-R/RW, DVD+R/RW and DVD-R/RW drivers. Optical disc drives are used in music and video playback and are implemented in recording devices and other electronic devices.

In order to effectively manage the information stored on a digital versatile disc, the data storage region of the digital versatile disc is divided into many frames. Data can be stored in these frames according to a memory format. Therefore, while in a writing process for a rewritable digital versatile disc, the DVD drive has to identify the memory format of the rewritable digital versatile disc before the writing process. In order to record the related information concerning the memory frames, there are special addressing structures on the rewritable digital versatile disc to record the related information. According to the specifications of a recordable or a rewritable digital versatile disc, the related information recorded in the addressing structures is known as the address in pre-groove (ADIP).

Please refer to FIG. 1. FIG. 1 is a schematic diagram showing a reading process on a reflecting surface of an optical disc by an optical pickup 31. On the reflecting surface of the optical disc, there is a fine spiral track 11 as is shown in FIG. 1. The fine track 11 is composed of two types of tracks, one being a data track 26 to record data, and the other being a wobble track 28 to record related addressing information of each frame.

As illustrated in the magnified view of FIG. 1, the data track 26 has an interrupt and discontinuity record mark 30, and the wobble track 28 has an oscillating shape. The surface of the wobble track 28 protrudes beyond the reflecting surface of the optical disc. The data track 26 is located inside a groove formed by the raised wobble track 28 as is shown in FIG. 1. The length of each record mark 30 varies, and the reflection characteristic of the record mark 30 is different from that of the other reflecting surface of the optical disc.

The optical pickup 31 comprises an optical receiver (not shown) for reading the data from the record mark 30 within the data track 26, and four optical sensors Sa, Sb, Sc, and Sd to extract tracking information from the wobble track 28. The positions of the sensors Sa and Sd in FIG. 1 are located on the groove area of the fine track 11 on the reflecting surface of the optical disc. However, the positions of the sensors Sb and Sc in FIG. 1 are located on the protruded area of the fine track 11.

As the optical disc rotates, the optical pickup 31 can be thought of as moving over the fine track 11 of the optical disc along the direction of arrow 32. The reflected laser beam intensities detected by the four sensors Sa, Sb, Sc, and Sd are different because of the difference in reflecting quality between the groove and the protruded area of the wobble track 28. As the optical pickup 31 moves along a straight path from the position shown to a position P1, the sensing values of the four sensors Sa, Sb, Sc, and Sd change. In other words, while the optical pickup 31 is located at the position P1, the positions of the sensors Sa and Sd are changed to be located on the protruded area of the fine track 11 and the positions of the sensors Sb and Sb are changed to be located on the groove area of the fine track 11.

By performing some well-known subtracting processes over the electrical sensing values of the four sensors Sa, Sb, Sc, and Sd, a wobble signal can be generated. Thereafter, the wobble signal can be utilized to generate an address in pre-groove (ADIP) through a decoding process.

It is well-known that the information of the ADIP is recorded in the wobble signal by a phase modulation technique, which means that the information is recorded according to the phase shift of a carrier. Every pair of record areas on an optical disc corresponds to 93 wobble cycles, and 8 wobble cycles of them are utilized to record an ADIP by phase modulation.

As aforementioned, since the ADIP is recorded in the wobble signal by phase modulation, an ADIP decoder is required for the disc drive to extract the ADIP from an optical disc. Please refer to FIG. 2. FIG. 2 shows a functional block diagram of a prior art analog ADIP decoder 40. The ADIP decoder 40 comprises a delay circuit 42, a mixer 44, a phase-locked loop (PLL) 46, a frequency divider 48, and an XOR operation logic circuit 50.

First of all, the functional operation of the analog ADIP decoder is processed based on the following trigonometric expression.

$$\mathrm{Sin}(\theta) * \mathrm{Cos}(\theta) = \frac{1}{2}\mathrm{Sin}(2\theta) \qquad \text{eq. (1)}$$

Wherein $\mathrm{Sin}(\theta)$ is used to describe the waveform of a wobble signal and $\mathrm{Cos}(\theta)$ is used to described the waveform of the other signal.

Therefore, if a phase shift of 180° of the wobble signal occurs, which means the corresponding waveform of the wobble signal becomes $\mathrm{Sin}(\theta+180°)$, another signal with a waveform of $0.5*\mathrm{Sin}(2\theta+360°)$ is generated according to eq. (1). The waveform function $0.5*\mathrm{Sin}(2\theta+360°)$ is actually equal to $0.5*\mathrm{Sin}(2\theta)$. In other words, a non-phase-modulated wobble clock can be generated by a phase-modulated wobble signal. After the wobble clock is generated, the ADIP decoder is able to extract the ADIP based on the wobble signal in conjunction with the wobble clock.

As is shown in FIG. 2, the signal S1 is a wobble signal. A signal S2 is generated by performing a quarter cycle delay process on the signal S1 by the delayed circuit 42, which causes a phase difference of 90° between the signal S1 and the signal S2. If the waveform of the signal S1 corresponds to Sin(θ), the corresponding waveform of the signal S2 becomes Sin(θ+90°) which is actually equal to Cos(θ). Thereafter, the signal S1 is multiplied by the signal S2 through the mixer 44 to generate a signal S3. As aforementioned, the waveform of the signal S3 then corresponds to the function 0.5*Sin(2θ), which means the frequency of the signal S3 is twice as high as the frequency of the signal S1. With the help of the signal S3, the phase-locked loop 46 is able to generate a signal S4 which is synchronized with the signal S3. The waveform of the signal S4 also corresponds to the function Sin(2θ). Next, the frequency divider 48 generates a signal S5 with half the frequency of the signal S4.

Since the signal S5 is a non-phase-modulated wobble clock and the signal S1 is a phase-modulated wobble signal, after an XOR operation is performed on the signal S1 and the signal S5 by the XOR operation logic circuit 50, an ADIP is extracted from the signal S1.

Because there is no analog differentiator to convert Sin(θ) precisely into Cos(θ), the delay circuit 42 is utilized to perform the conversion. However, if the rotating speed of the optical disc keeps changing, the frequency of the signal S1 also changes accordingly. Therefore, the delay circuit 42 is required to adjust the delay parameters according to the changing cycles of the signal S1. Based on the functional demands described above, the delay circuit 42 becomes complicated and is hard to implement.

Please refer to FIG. 3. FIG. 3 shows a functional block diagram of a prior art digital ADIP decoder 60. The ADIP decoder 60 comprises an analog-to-digital converter (ADC) 62, a differentiator 64, a multiplier 66, a PLL 68, a frequency divider 70, and an XOR operation logic circuit 72. In a similar way described before, based on the eq. (1), the digital ADIP decoder 60 is able to generate a wobble clock from a wobble signal and extract an ADIP from the wobble signal.

Because the signal S1 is an analog wobble signal, the analog-to-digital converter 62 is required to convert the analog signal S1 into a digital signal S2 for further digital signal processing. The differentiator 64 generates a signal S3 by performing a differentiating process on the signal S2. In other words, if the analog signal S1 corresponds to a function Sin(θ), then the digital signal S2 should be a digital signal corresponding to the same function Sin(θ) and the digital signal S3 should be a digital signal corresponding to the function Cos(θ). Thereafter, the digital signal S2 is multiplied by the digital signal S3 through the multiplier 66 to generate a digital signal S4.

According to the eq. (1), the digital signal S4 corresponds to the function 0.5*Sin(2θ), which means the frequency of the digital signal S4 is twice as high as the frequency of the digital signal S2. With the aid of the digital signal S4, the phase-locked loop 68 is able to generate a digital signal S5, which is synchronized with the digital signal S4. Consequently, the digital signal S5 also corresponds to the function Sin(2θ). Thereafter, the frequency divider 70 generates a digital signal S6 with half the frequency of the digital signal S5.

Since the digital signal S6 corresponds to a non-phase-modulated wobble clock waveform and the digital signal S2 corresponds to a phase-modulated wobble signal, after an XOR operation is performed on the digital signal S2 and the digital signal S6 by the XOR operation logic circuit 72, an ADIP is extracted from the signal S2.

As aforementioned, the operation of the digital ADIP decoder 60 requires an analog-to-digital conversion and a digital differentiating process, which means the demand for ultra high speed operation of the circuits must be achieved to be integrated into a high-performance DVD drive. Furthermore, in order to achieve high resolution in the analog-to-digital converting process, higher bits per sampling signal data is another stringent requirement of the digital ADIP decoder 60 for a high-performance DVD drive. Again, because of the stringent requirements described above, the digital ADIP decoder 60 is actually a complicated and high-cost circuit for a high-performance DVD drive.

SUMMARY OF INVENTION

It is therefore a primary objective of the claimed invention to provide a wobble clock generator having a shared oscillating signal utilized to generate a wobble clock and to act as a reference clock for a protective mechanism capable of avoiding interference generated from a phase-modulated wobble signal using a cost-effective and labor saving circuit design to solve the above-mentioned problem of the prior art wobble clock generator.

According to a preferred embodiment of the claimed invention, the wobble clock generator comprises an operation circuit for receiving a wobble signal and calculating a number of cycles of an oscillating signal during a cycle of the wobble signal to derive a cycle value and comparing the cycle value with a preset cycle value to output a first protection signal, and a phase-locked loop circuit connected to the operation circuit for receiving the wobble signal, the wobble clock and the first protection signal, and determining whether the wobble clock is to be synchronized with the wobble signal according to the first protection signal.

According to a preferred method of the claimed invention, a non-phase-modulated wobble clock is generated according to a phase-modulated wobble signal. The method for generating the wobble clock comprises receiving a wobble signal and an oscillating signal, calculating a cycle value by counting cycles of an oscillating signal during a cycle of the wobble signal, comparing the cycle value with a preset cycle value to generate a first protection signal, determining whether the wobble clock is to be synchronized with the wobble signal according to the first protection signal and generating a control signal, generating a control voltage according to the control signal, and adjusting the frequency of the oscillating signal according to the control signal.

The oscillating signal is shared to generate the wobble clock with the phase-locked loop circuit and to act as a reference clock for generating the first protection signal with the operation circuit.

Compared to the prior art, the wobble clock generator of the claimed invention is able to generate the non-phase-modulated wobble clock dynamically according to the phase-modulated wobble signal no matter how the phase-modulated wobble signal may drift. Besides, the oscillating signal generated by the phase-locked loop circuit is utilized both to generate a wobble clock through a frequency-dividing process and to act as a reference clock for the operation circuit to generate the first protection signal. In other words, an extra clock generator for generating a reference clock to drive the counter is put aside compared to the prior art. Consequently, the circuit design of the wobble clock generator of the claimed invention is relatively simple and easy to implement, which means the wobble clock generator is a cost-effective circuit for any DVD+R disc drive or DVD+RW disc drive.

These and other objectives of the claimed invention will no doubt become obvious to those of ordinary skill in the art

DETAILED DESCRIPTION

Figure 1:
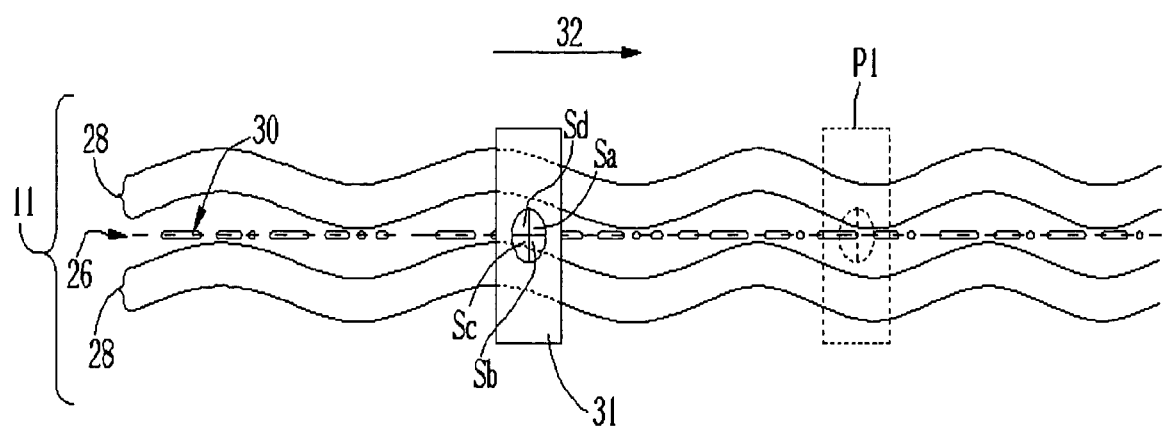
FIG. 1 is a schematic diagram showing a reading process on a reflecting surface of an optical disc by an optical pickup.
Figure 2:
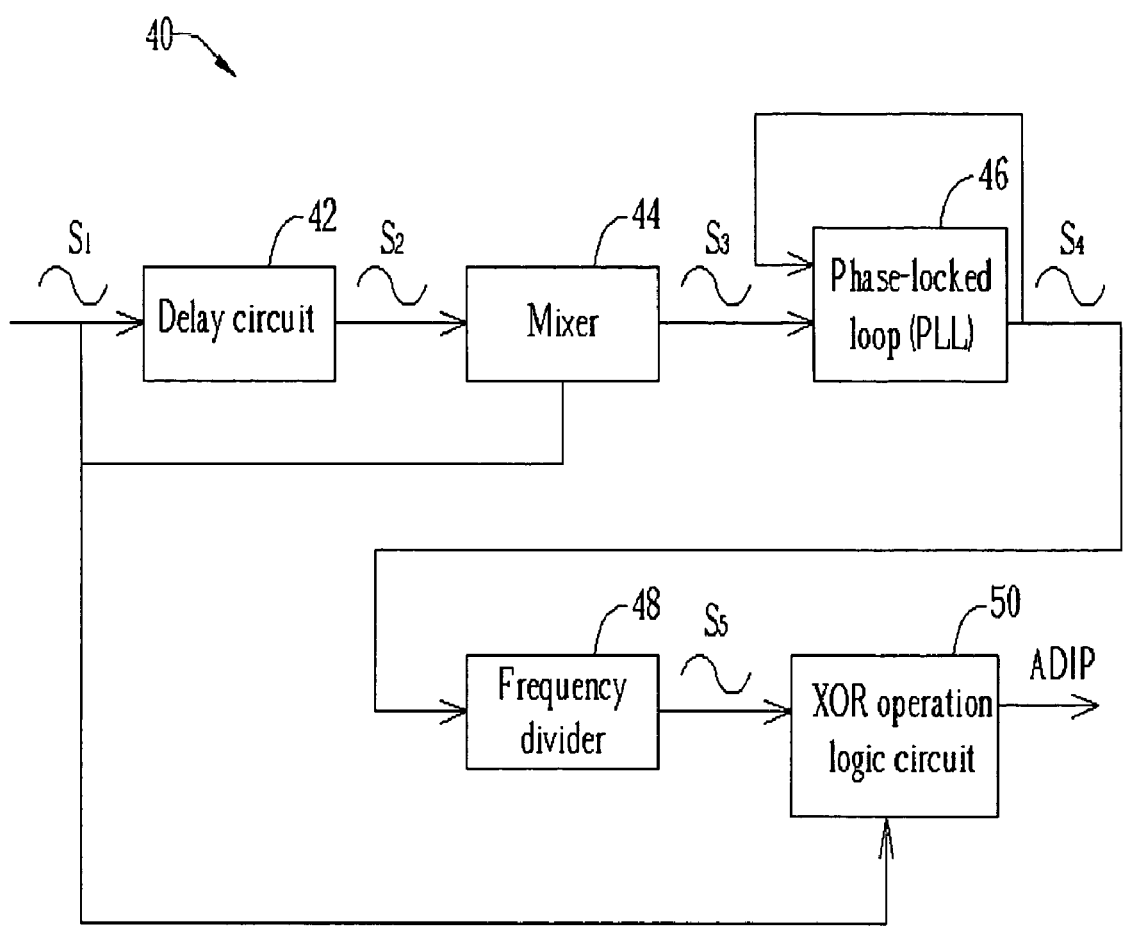
FIG. 2 is a functional block diagram of a prior art analog ADIP decoder.
Figure 3:
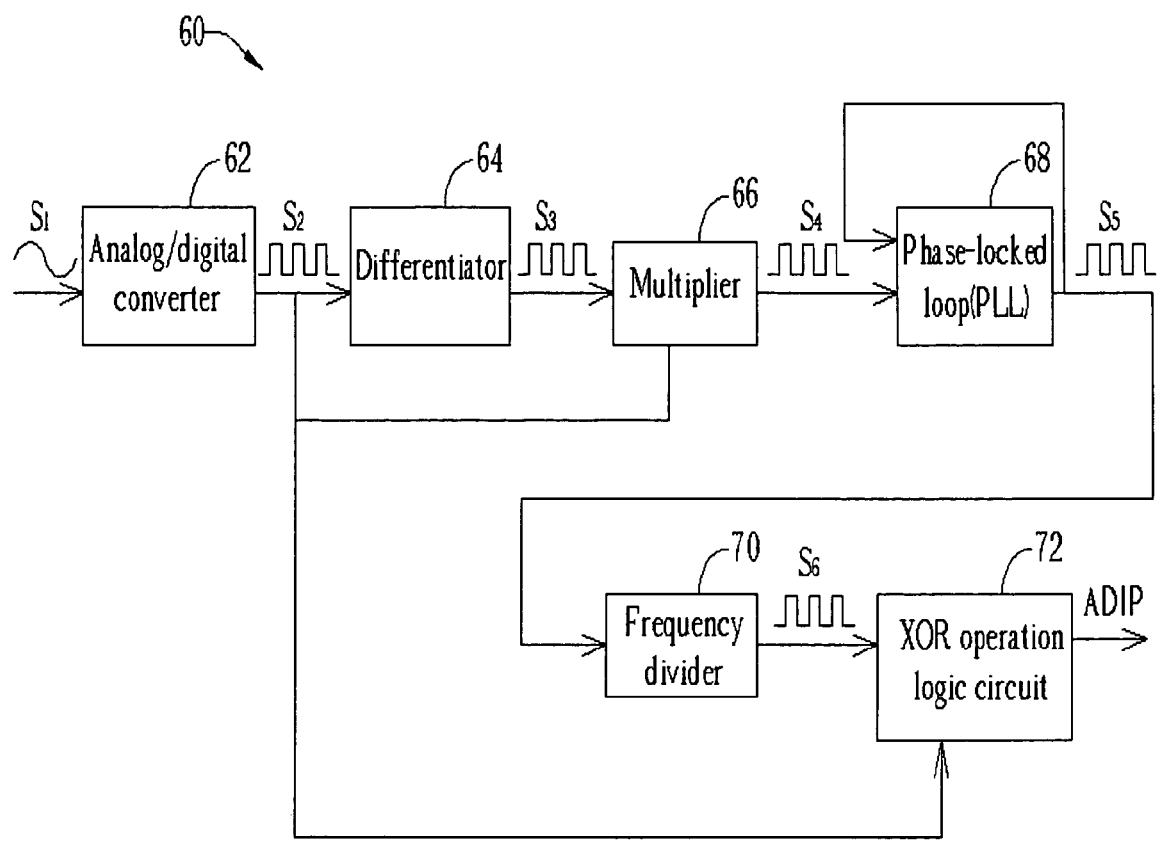
FIG. 3 is a functional block diagram of a prior art digital ADIP decoder.
Figure 4:
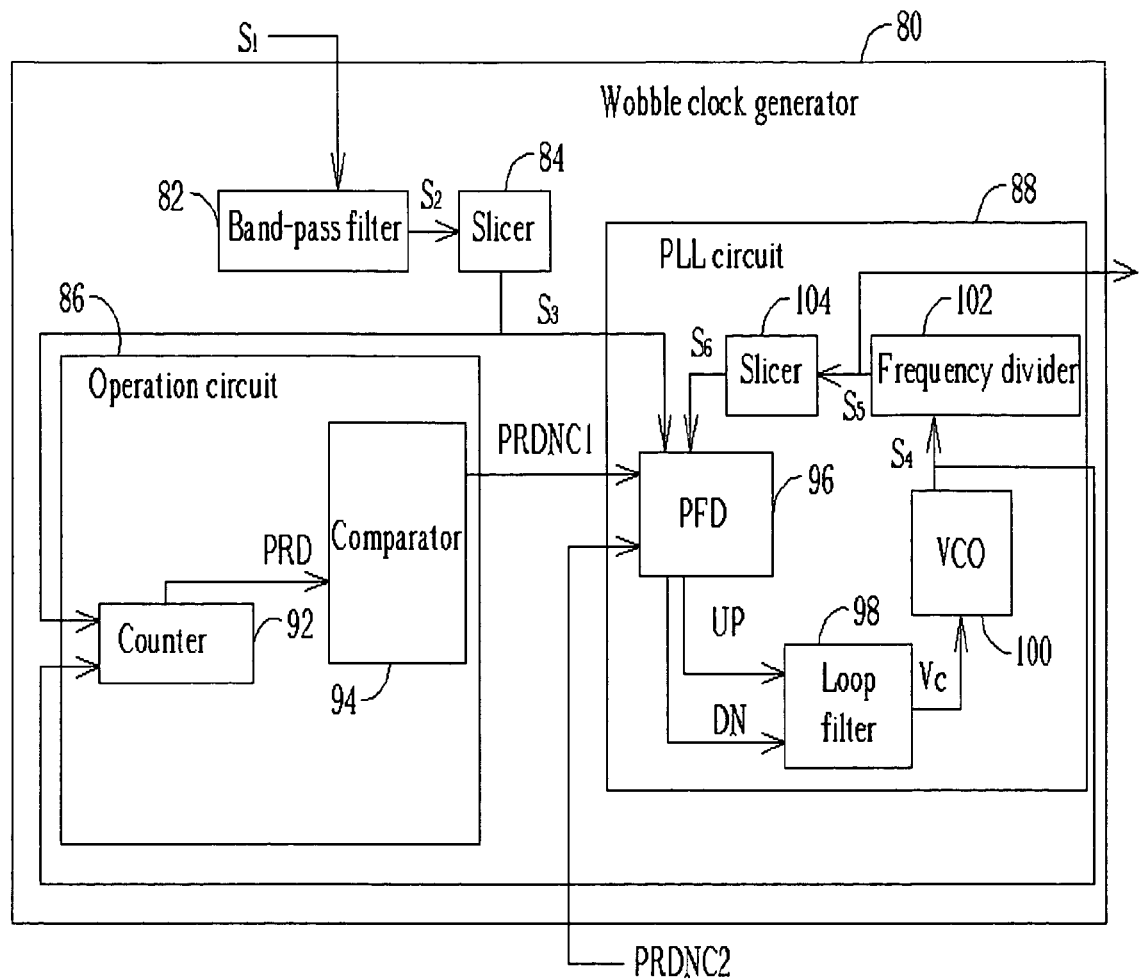
FIG. 4 is a functional block diagram of a wobble clock generator according to one preferred embodiment of the claimed invention.

Please refer to FIG. 4. FIG. 4 shows a functional block diagram of a wobble clock generator 80 according to one preferred embodiment of the claimed invention. The wobble clock generator 80 comprises a band-pass filter (BPF) 82, a slicer 84, an operation circuit 86, and a phase-locked loop (PLL) 88. The operation circuit 86 comprises a counter 92, and a comparator 94. The phase-locked loop 88 comprises a phase-frequency detector (PFD) 96, a loop filter 98, a voltage-controlled oscillator (VCO) 100, a frequency divider 102, and a slicer 104.

The wobble clock generator 80 can be applied to a DVD+R disc drive or a DVD+RW disc drive. According to the specifications of a DVD+R disc drive or a DVD+RW disc drive, the ADIP is recorded in the corresponding phase-modulated wobble signal. For that reason, a non-phase-modulated wobble clock is required to decode the ADIP. Consequently, the wobble clock generator 80 is utilized to generate the non-phase-modulated wobble clock S5 from the phase-modulated wobble signal S1 as is shown in FIG. 4. According to the preferred embodiment, the quality factor (Q factor) of the band-pass filter 82 is required to be high enough to process a sharp band-pass filtering of S1 and generate a signal S2. In the filtering process performed by the band-pass filter 82 over the phase-modulated wobble signal S1, a phase lag and a frequency drifting phenomena occur on the signal S2. After the signal S2 is generated, the slicer 84 is utilized to convert the signal S2 having a sinusoidal waveform into a signal S3 having a square waveform. The signal S3 output from the slicer 84 is then forwarded to both the operation circuit 86 and the phase-locked loop 88.

Concerning the circuit operation of the phase-locked loop 88, the phase-frequency detector 96 compares the frequency and phase differences between the signal S3 and the signal S6 and outputs a control signal UP and a control signal DN. When the control signal UP and the control signal DN are forwarded to the loop filter 98, the loop filter 98 is able to generate a DC control voltage Vc for the voltage-controlled oscillator 100 according to the control signal UP and the control signal DN. Traditionally, there are charge pump circuits incorporated in the loop filter 98 to alter the DC control voltage Vc. In other words, with the aid of the charge pump circuits, the loop filter 98 is able to increase the DC control voltage Vc while receiving the control signal UP and decrease the DC control voltage Vc while receiving the control signal DN. Besides, the loop filter 98 normally comprises a low-pass filter to stabilize the DC control voltage Vc. Thereafter, the voltage-controlled oscillator 100 is capable of generating a signal S4 having a frequency according to the DC control voltage Vc.

According to the preferred embodiment, the frequency of the signal S4 generated by the voltage-controlled oscillator 100 is higher than the frequency of the corresponding signal S1. For instance, according to the specifications of a DVD+R disc drive or a DVD+RW disc drive, the time duration of one cycle of the wobble signal equals the time duration for a 32-bit writing process on an optical disc. Therefore, if a one-bit writing process on an optical disc equals 1T, then the time duration of one cycle of the wobble signal corresponds to 32T. In other words, according to the preferred embodiment, the frequency of the signal S4 generated by the voltage-controlled oscillator 100 is 32 times as high as the frequency of the signal S1. For example, if the frequency of the signal S1 is 817.5 KHz, which corresponding to a 1× speed of the optical disc, then the frequency of the signal S4 equals 26.16 MHz.

As aforementioned, since the frequency of the signal S4 is higher than the frequency of the signal S3, the frequency divider 102 is required to generate the signal S5 having a lower frequency, which is equal to the frequency of the signal S3, from the signal S4. For instance, if the frequency of the signal S4 is 32 times as high as the frequency of the signal S1, the frequency of the signal S4 is divided by 32 through the frequency divider 102 to generate the signal S5 having the same frequency as that of the signal S1. Please note that the aforementioned number 32 is only given as an example and should not be taken as a limitation. That is to say, if the frequency of the signal S4 is k times as high as the frequency of the signal S1, the frequency of the signal S4 is divided by k through the frequency divider 102 to generate the signal S5 having the same frequency as that of the signal S1.

Thereafter, the slicer 104 performs a waveform slicing process to convert the signal S5 having a sinusoidal waveform into a signal S6 having a square waveform. The signal S6 having a square waveform is then fed back to the phase-frequency detector 96. As is described above, the phase-locked loop 88 is able to correct the frequency and phase errors through a feedback mechanism until the signal S6 is in phase with the signal S3. As the signal S6 is synchronized with the signal S3, the signal S5 is actually a wobble clock and is utilized to extract tracking information ADIP by decoding the phase-modulated wobble signal S1. Besides, according to the preferred embodiment, although the frequency divider 102 is incorporated in the phase-locked loop 88, there are alternative circuits according to the claimed invention which has the frequency divider 102 located outside the phase-locked loop 88 to perform a dividing process over the signal S4 and generate the signal S5.

The detailed operation of the phase-locked loop 88 is described hereafter. For instance, if a rising edge of the signal S6 occurs before a corresponding rising edge of the signal S3, the phase-frequency detector 96 is triggered to generate a control signal DN to decrease the DC control voltage Vc with the loop filter 98, which in turn will decrease the frequency of the signal S6 and delay the occurrence of the rising edge of the signal S6. Thereby, a correcting process for the signal S6 having a phase leading over the signal S3 proceeds until the rising edges of the signal S6 and the signal S3 occur simultaneously. On the contrary, if a rising edge of the signal S6 occurs after a corresponding rising edge of the signal S3, the phase-frequency detector 96 is triggered to generate a control signal UP to increase the DC control voltage Vc with the loop filter 98, which in turn will increase the frequency of the signal S6 and advance the occurrence of the rising edge of the signal S6. Thereby, a correcting process for the signal S6 having a phase lagging over the signal S3 proceeds until the rising edges of the signal S6 and the signal S3 occur simultaneously. However, during the correcting process of S6, the phase relationship between the signal S6 and the signal S3 may switch between leading and lagging, consequently a feedback mechanism based on the two aforementioned correcting processes is utilized to correct the phase and frequency of the signal S6 at any moment.

When the signal S6 and the signal S3 are in phase, which means the rising edges of the signal S6 and the signal S3 occur simultaneously to trigger the phase-frequency detector 96 to generate both the control signal UP and the control signal DN, the triggered durations of the control signal UP and the control signal DN are the same and the DC control voltage Vc of the phase-locked loop 88 remains unchanged for holding the signal S6. Please note that the phase locking process for the signal S6 can be done based on the falling edges of the signals for the triggering mechanism.

According to the well-known specifications of the DVD+R optical drive and the DVD+RW optical drive, the information of an ADIP is recorded in the wobble signal. An ADIP unit corresponds to 93 wobble cycles and 8 wobble cycles of them are utilized to record an ADIP sync unit or an ADIP data unit by phase modulation. The other 85 wobble cycles are not phase modulated to record any information. In other words, the 8 phase-modulated wobble cycles are able to pose some effect on the signal S3 and the frequency of the signal S3 becomes unstable. If the phase-locked loop 88 controls the frequency and phase of the signal S5 based on the signal S3 having an unstable frequency, the frequency of the signal S5 generated is also unstable. For instance, when the phase-locked loop 88 has finished the operation over the signal S5 to hold the signal S5 having correct phase and correct frequency in the duration of the 85 non-phase-modulated wobble cycles and proceeds to perform a decoding process over the signal S1, the input of the subsequently 8 phase-modulated wobble cycles to the wobble clock generator 80 is able to cause an error operation of the phase-locked loop 88 and which in turn will bias the frequency and phase of the signal S5 from the desired values. Under such circumstance, the wobble clock generator 80 is not able to output a stable signal S5 persistently. More to the point, if both the frequency and phase of the signal S5 drift significantly from the desired values, a longer duration for the phase-locked loop 88 to relock the desired signal S5 is required. Accordingly, the performance of the phase-locked loop 88 degrades.

Therefore, the purpose of the operation circuit 86 according to the claimed invention is to provide a protective mechanism capable of avoiding the process of driving the signal S6 to be synchronized with the signal S3 while receiving an unstable signal S3 in the corresponding phase-modulating duration.

According to the preferred embodiment, the high frequency signal S4 generated by the voltage-controlled oscillator 100 is forwarded to both the frequency divider 102 and the counter 92. The counter 92 then calculates a cycle value PRD by counting the number of cycles of the signal S4 during a cycle of the signal S3. In other words, the counter 92 is used to evaluate the number of cycles of the signal S4 corresponding to one cycle of the signal S3. By this means, the counter 92 is able to determine the duration of one cycle of the signal S3 by the cycle value PRD.

Thereafter, the comparator 94 according to the preferred embodiment is employed to compare the cycle value PRD with a preset cycle value and determines whether the signal S3 is in a frequency-unstable state, which means determining whether the phase-modulated cycle is forwarded to the wobble clock generator 80. Based on the comparison between the cycle value PRD and the preset cycle value, the comparator 94 generates a first protection signal PRDNC1 and forwards the first protection signal PRDNC1 to the phase-frequency detector 96. For instance, if the signal S3 is in a frequency-unstable state, then the difference between the cycle value and the preset cycle value is larger than a critical value. Furthermore, if the differences of a plurality of the consecutive cycle values and the preset cycle value are all larger than the critical value, the first protection signal PRDNC1 is generated to prohibit the phase-frequency detector 96 from outputting the control signals UP and DN. Next, since neither of the control signal UP and DN are received by the loop filter 98, the DC control voltage Vc is held unchanged, which causes the voltage-controlled oscillator 100 to hold the signal S4. As a result, the phase-locked loop 88 is not going to drive the signal S6 to be synchronized with the signal S3 under frequency-unstable circumstances of the signal S3.

Based on the above description, when the phase-modulated cycles of the signal S0 are forwarded to the wobble clock generator 80 and frequency-unstable circumstances of the signal S2 occur, the operation circuit 86 of the preferred embodiment is able to output a first protection signal PRDNC1 to prohibit the phase-locked loop 88 from driving the signal S6 to be synchronized with the signal S3. The situation proceeds until the non-phase-modulated cycles of the signal S1 are forwarded to the wobble clock generator 80 and frequency-stable circumstances of the signal S3 occur. As the non-phase-modulated cycles of the signal S1 are forwarded to the wobble clock generator 80, the difference between the cycle value and the preset cycle value is not larger than the critical value, and the comparator 94 resets the first protection signal PRDNC1 so that the phase-frequency detector 96 is able to output the control signals UP and DN to the loop filter 98 and the phase-locked loop 88 is able to drive the signal S6 to be synchronized with the signal S3.

As aforementioned, the slicer 84 converts the signal S2 having a sinusoidal waveform into the signal S3 having a square waveform based on two slicing levels. As the phase-modulated cycles of the signal S1 are processed by the band-pass filter 82 having a high quality factor, frequency-unstable circumstances of the signal S2 may occur, which means the duration of the frequency-unstable circumstances of the signal S2 is longer than an expected value. In other words, although there are only 8 phase-modulated cycles in an ADIP unit, after the operation by the band-pass filter having a high quality factor, the frequency-unstable circumstance of the signal S2 proceeds after the 8 phase-modulated cycles. For instance, the effect of the 8 phase-modulated cycles in an ADIP unit may cause the frequency-unstable circumstance of the signal S2 for about 8–30 cycles.

However, while generating the wobble signal S1 by reading the information of the wobble track on an optical disc, owing to the variation of the rotating speed of the spindle motor of the disc drive or any vibration caused by the disc eccentricity, the variation of the frequency of the wobble signal S1 may also occur. Under such circumstance, the number of the frequency-unstable cycles of the signal S3 may fall outside the range from 8 to 30, and the signal S6 is required to be synchronized with the signal S3.

Furthermore, as aforementioned, according to the preferred embodiment, the frequency of the signal S4 is 32 times as high as the frequency of the signal S3. Consequently, an ideal cycle value PRD generated by counting the number of cycles of the signal S4 in one cycle of the signal S3 is 32. However, the 8–30 unstable-cycle circumstances of the signal S3 cause the corresponding cycle value PRD to bias from the ideal value of 32 significantly. Therefore, the cycle values PRD corresponding to the 8–30 consecutive unstable cycles can be utilized to determine whether the signal S5 is the desired wobble clock. For instance, if the critical value of the difference of the cycle value PRD and the preset cycle value is set to be 1, then the cycle value PRD ranging from 31 to 33 is determined to correspond to a non-phase-modulated cycle. Otherwise the cycle value PRD is determined to correspond to a phase-modulated cycle caused by an unstable-cycle circumstance of the signal S3.

Figure 5:
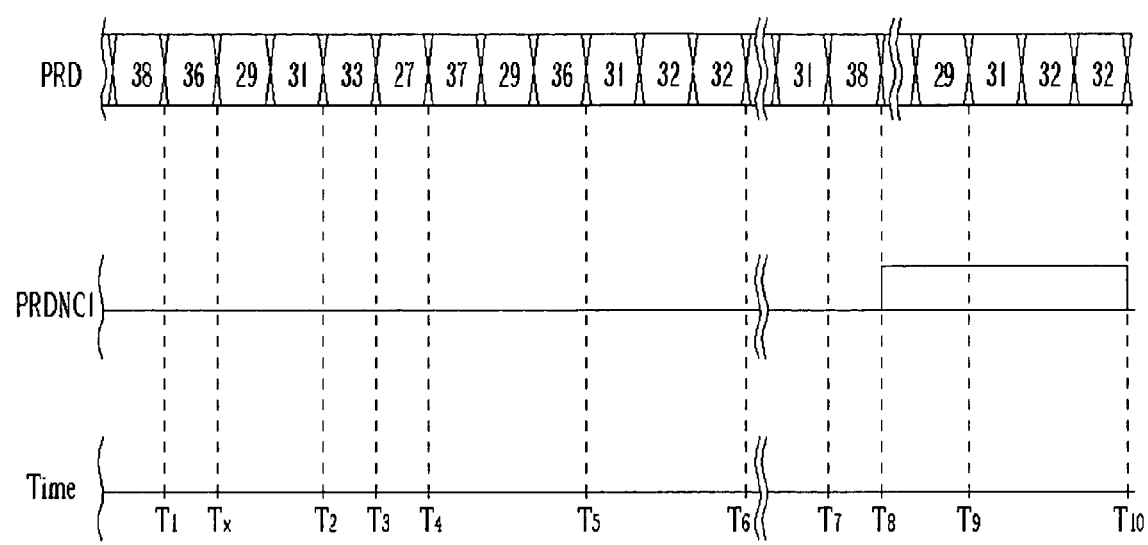
FIG. 5 is a diagram of schematic waveforms of the cycle value PRD and the first protection signal PRDNC1.

Please refer to FIG. 5. FIG. 5 is a diagram of schematic waveforms of the cycle value PRD and the first protection signal PRDNC1, which are actually the operating clock waveforms related to operation circuit 86, with time along the abscissa. As is shown in FIG. 5, a cycle value PRD of 38 is generated by the counter 92 and is forwarded to the comparator 94 at a time T1. Thereafter, the comparator 94 evaluates whether the number of consecutive cycle values corresponding to the phase-modulated cycles of the signal S3 ranges from 8 to 30. Please note that there might be some cycles having cycle values ranging from 31 to 33 enclosed in a series of the phase-modulated cycles of the signal S3. For instance, at times T2 and T3 shown in FIG. 5, the cycle values PRD generated by the counter 92 are 31 and 33 respectively, which are actually enclosed in a series of the phase-modulated cycles of the signal S3. Accordingly, according to the preferred embodiment, the situation of the signal S3 is judged to correspond to the non-phase-modulated cycles of the signal S1 only when there are 3 consecutive cycles of the signal S3 having cycle values ranging from 31 to 33. Therefore, although there are 2 consecutive cycles of the signal S3 having cycle values ranging from 31 to 33, the situation of the signal S3 is still judged to correspond to the phase-modulated cycles of the signal S1, which corresponds to an unstable situation. However, there are 3 consecutive cycles of the signal S3 having cycle values ranging from 31 to 33 occur at a time T6, and the situation of the signal S3 is judged to correspond to the non-phase-modulated cycles of the signal S1. Based on the description above, before a time T5, because there are 9 consecutive cycles of the signal S3 that are judged to correspond to the phase-modulated cycles of the signal S1, the comparator 94 is able to determine that the signal S6 might have been driven to be synchronized with the signal S3. Therefore, a protecting process is triggered to prevent the phase-locked loop 88 from altering the frequency of the signal S4 based on subsequent unstable situations. For another example, if the cycle values PRD in the time duration between T6 and T7 all fall into the range between 31 and 33, and the cycle value PRD equals 38, which falls outside the range between 31 and 33, at next time T8, then the comparator 94 is driven to trigger a first protection signal PRDNC1 concurrently and forwards the first protection signal PRDNC1 to the phase-frequency detector 96. After the phase-frequency detector 96 receives the first protection signal PRDNC1, the phase-frequency detector 96 stops outputting the control signals UP and DN to the loop filter 98, which causes the loop filter 98 to hold the control voltage Vc. Consequently, the voltage-controlled oscillator 100 holds the frequency of the signal S4 based on the fixed control voltage Vc. In other words, immediately after the time T8, the phase-locked loop 88 is not going to drive the signal S6 to be synchronized with the signal S3. Thereafter, based on the description above, there are 3 consecutive cycles of the signal S3 having cycle values ranging from 31 to 33 occurring at a time T10, and the situation of the signal S3 is then judged to correspond to the non-phase-modulated cycles of the signal S1, which corresponds to a stable situation. Therefore, after the time T10, the signal S3 is judged to be unaffected by the phase-modulated cycles of the signal S1, and the comparator 94 resets the first protection signal PRDNC1 to allow the phase-locked loop 88 to drive the signal S6 to be synchronized with the signal S3. However, if there is any cycle value PRD falling outside the range between 31 and 33 after the time T10, then the comparator 94 will again trigger another first protection signal PRDNC1 to initiate the abovementioned protective process.

However, if the number of the phase-modulated cycles of the signal S1 determined by the comparator 94 in the time duration between the times T8 and T9 falls outside the range from 8 to 30, the unstable situation is then judged to be caused by the variation of the rotating speed of the spindle motor of the disc drive or by any vibration due to the disc eccentricity. Under such circumstance, the comparator 94 is required to stop the protecting process and allow the phase-locked loop 88 to drive the signal S6 to be synchronized with the signal S3.

As is shown in FIG. 4, although the signal S3 is forwarded to both the phase-frequency detector 96 and the operation circuit 86, the signal S3 has to go through the counter 92 and the comparator 94 so as to generate a first protection signal PRDNC1 required by the phase-frequency detector 96. In other words, before the first protection signal PRDNC1 corresponding to the signal S3 is generated, there is a time delay caused by a counting process of the counter 92, and a comparing process of the comparator 94. Therefore, the timing for the operation circuit 86 to output the first protection signal PRDNC1 is preceded by the timing for the phase-frequency detector 96 to receive the signal S3. That is to say, when the signal S3 is under frequency-unstable circumstances, the signal S6 is driven to be synchronized with the signal S3 before the first protection signal PRDNC1 having a high level signal is forwarded to the phase-frequency detector 96 to stop outputting the control signals UP and DN.

In order to solve the above-mentioned problem, another wobble clock generator 80 of the claimed invention with a protective mechanism is provided and detailed hereafter. As aforementioned, according to the well-known specifications of the DVD+R optical drive and the DVD+RW optical drive, an ADIP unit corresponds to 93 wobble cycles and 8 wobble cycles of them are utilized to record an ADIP sync unit or an ADIP data unit by phase modulation. The other 85 wobble cycles are not phase modulated to record any information. The 85 non-phase-modulated wobble cycles enclosed in the phase-modulated signal S1 are then utilized to generate the non-phase-modulated signal S5. Thereafter, a decoding process based on an XOR operation is performed on the non-phase-modulated wobble signal and the phase-modulated signal to generate an ADIP. With the aid of the signal S5 generated by the wobble clock generator 80 of the claimed invention, an ADIP can be generated from the corresponding 8 wobble cycles in an ADIP unit. According to the specifications of the DVD+R optical drive and the DVD+RW optical drive, the subsequent 85 wobble cycles should be in phase with the signal S5. Thereby, if an ADIP is decoded with the aid of the signal S5, the signal S5 is actually the desired wobble clock generated by the wobble clock generator 80. As a result, the beginning timing of the subsequent ADIP unit can be predicted, and the timing for the 8 phase-modulated wobble cycles to input to the phase-locked loop 88 is preceded by the timing for the phase-frequency detector 96 to stop outputting the control signals UP and DN with a predetermined time interval.

Figure 6:
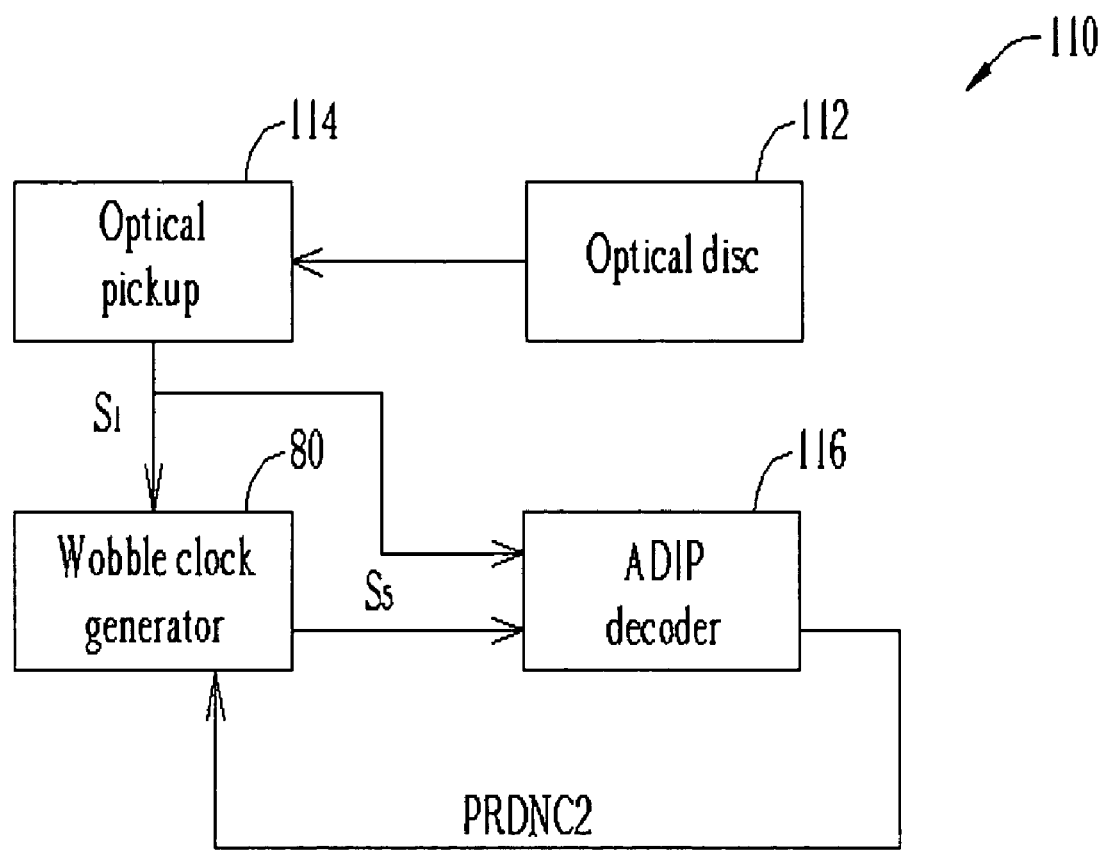
FIG. 6 is a functional block diagram of an optical disc access system according to another preferred embodiment of the claimed invention.

Please refer to FIG. 6. FIG. 6 is a functional block diagram of an optical disc access system 110 according to another preferred embodiment of the claimed invention. The optical disc access system 110 comprises an optical disc 112, an optical pickup 114, a wobble clock generator 80, and an ADIP decoder 116. The optical pickup 114 is able to fetch a phase-modulated wobble signal, i.e. S1, from the wobble track on the reflecting surface of the optical disc 112. As aforementioned, the wobble clock generator 80 is utilized to generate a non-phase-modulated wobble signal, i.e. S5, based on the phase-modulated signal S1, and an ADIP carried by the signal S1 is decoded with the aid of the signal S5 by the ADIP decoder 116. In other words, the ADIP can be decoded by performing an XOR operation on the signal S5 and the signal S1, and each ADIP corresponds to each 93 wobble cycles. Since there are 85 non-phase-modulated wobble cycles preceded by the 8 phase-modulated wobble cycles, the ADIP decoder 116 is able to predict the timing for the input of the next first wobble cycle of the signal S1 in the decoding process. Furthermore, because a phase shift of 180° occurs at the first wobble cycle, the timing for generating the first protection signal PRDNC1 based on the signal S3 by the operation circuit 86 shown in FIG. 4 lags the timing of the input of the first wobble cycle of the signal S3 to the phase-locked loop 88, which causes an error process to be performed on the signal S5 as described above.

Therefore, according to the preferred embodiment shown in FIG. 6 and FIG. 4, after a plurality of the ADIP units are decoded by the ADIP decoder 116 based on the signal S5 generated by the phase-locked loop 88, the ADIP decoder 116 is able to predict the timing for the input of the first wobble cycle corresponding to the next ADIP unit and generates a second protection signal PRDNC2. The second protection signal PRDNC2 is forwarded to the phase-frequency detector 96 and functions similar to the first protection signal PRDNC1 to stop outputting the control signals UP and DN at a predetermined time based on the predicted timing before the input of the first wobble cycle corresponding to the next ADIP unit. Furthermore, in the same way described above, when all the differences between a plurality of the consecutive cycle values PRD and the preset cycle value are not larger than the critical value, both the protection signals PRDNC1 and PRDNC2 are reset.

More to the point, as the comparator 96 resets the first protection signal PRDNC1, the second protection signal PRDNC2 is also reset accordingly to allow the phase-locked loop 88 to perform the phase locking process. Besides, there are situations when the aforementioned protective mechanism is initiated, the ADIP decoder 116 is not able to predict the timing for the input of the next first wobble cycle of the signal S1 in the decoding process with the aid of the signal S5 generated by the phase-locked loop 88. In other words, although the ADIP decoder 116 predicts a time T for the input of the next first wobble cycle of the signal S1, the timing of the input of the next first wobble cycle of the signal S1 is actually at another time T'. That is to say, there is something wrong with the signal S5 generated by the phase-locked loop 88. According to the preferred embodiment, under such circumstances, the ADIP decoder 116 will stop the preceded protecting process.

Figure 7:
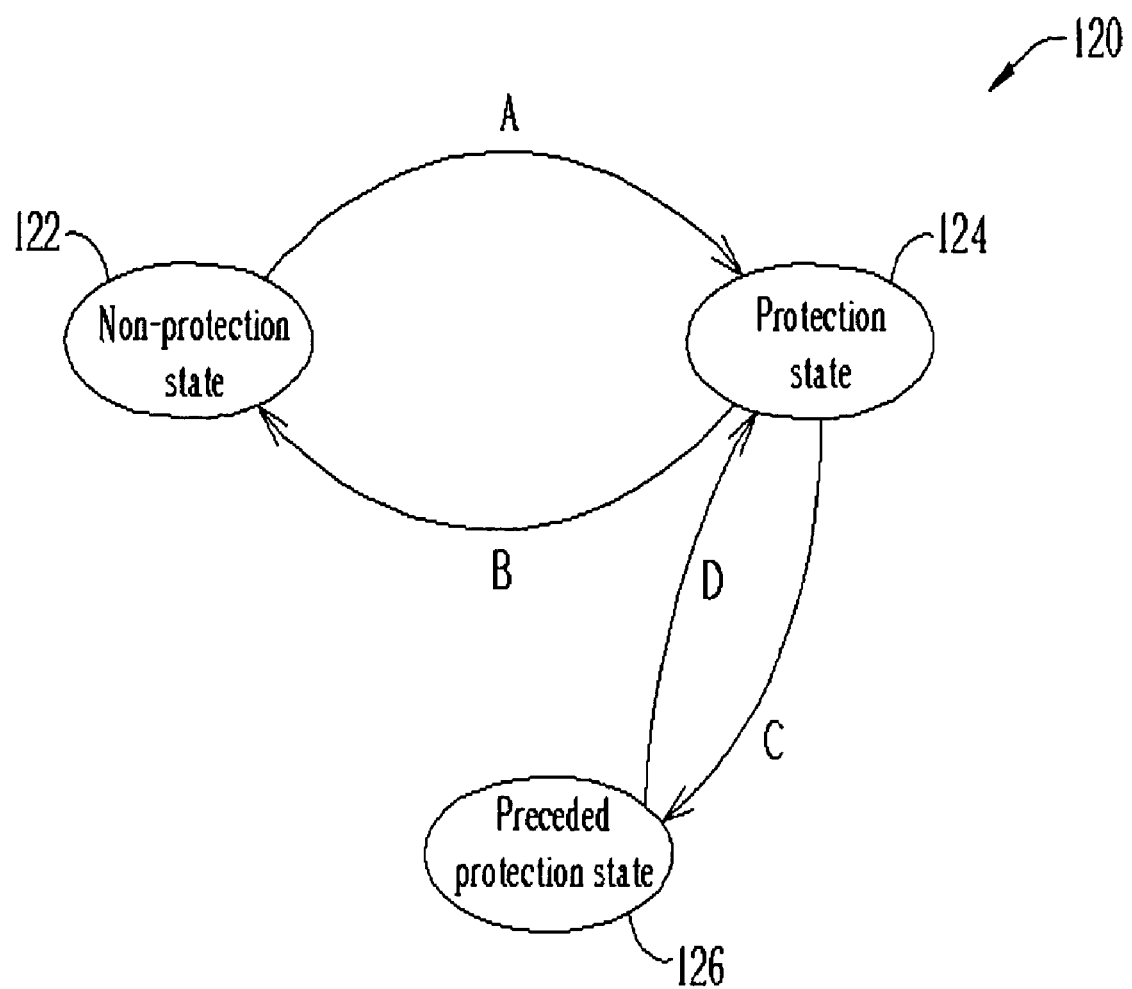
FIG. 7 is a state machine diagram schematically showing a state machine of the protecting process of the optical disc access system 110 in FIG. 6.

Please refer to FIG. 7. FIG. 7 is a state machine diagram schematically showing a state machine 120 of the protecting process of the optical disc access system 110 in FIG. 6. The state machine 120 comprises a non-protection state 122, a protection state 124, and a preceded protection state 126. When the optical disc access system 110 is initiated, the optical disc access system 110 holds a non-protection state 122. While in the non-protection state 122, the phase-locked loop 88 is able to drive the signal S6 to be synchronized with the signal S3 and correct the phase difference between the signal S6 and the signal S3. When a condition A occurs, the optical disc access system 110 is switched from the non-protection state 122 to the protection state 124. The condition A corresponds to a circumstance in which the number of the frequency-unstable consecutive cycles of the signal S3 falls into the range from 8 to 30.

In the protection state 124, as soon as the differences of a preset number of the consecutive cycles values PRD and the preset cycle value are all larger than the critical value, the comparator 94 will trigger the first protection signal PRDNC1 to stop the phase-frequency detector 96 from outputting the control signals UP and DN.

While in the protection state 124, when a condition B occurs, the optical disc access system 110 is switched from the protection state 124 back to the non-protection state 122. The condition B corresponds to a circumstance in which the number of the frequency-unstable consecutive cycles of the signal S3 fails outside the range from 8 to 30.

While in the protection state 124, when a condition C occurs, the optical disc access system 110 is switched from the protection state 124 to the preceded protection state 126. The condition C corresponds to a circumstance in which the ADIP decoder 116 is able to predict the timing for the input of the next first wobble cycle of the signal S1 in the decoding process.

In the preceded protection state 126, the ADIP decoder 116 is able to predict the timing for the input of the first wobble cycle of the signal S1 in the decoding process and generates a second protection signal PRDNC2. The second protection signal PRDNC2 can drive the phase-frequency detector 96 to stop outputting the control signals UP and DN at a predetermined time based on the predicted timing before the input of the first wobble cycle corresponding to the next ADIP unit.

While in the preceded protection state 126, when a condition D occurs, the optical disc access system 110 is switched from the preceded protection state 126 back to the protection state 124. The condition D corresponds to a circumstance in which the ADIP decoder 116 is not able to predict a correct timing for the input of the next first wobble cycle of the signal S1 in the decoding process.

To sum up, when the signal S6 is synchronized with the signal S3, the optical disc access system 110 is switched from the non-protection state 122 to the protection state 124 having a protective mechanism based on the first protection signal PRDNC1. Furthermore, as the signal S5 is stabilized, the ADIP decoder 116 is able to predict the timing for the input of the next first wobble cycle of the signal S1 in the decoding process and generates a second protection signal PRDNC2. Thereafter, the optical disc access system 110 is further switched from the protection state 124 to the preceded protection state 126 having a protective mechanism based on the second protection signal PRDNC2. As a result, the wobble clock generator 80 proceeds through the non-protection state, the protection state, and the preceded protection state of the state machine 120 to drive the signal S6 to be synchronized with the signal S3 and outputs the stable signal S5 to the ADIP decoder 116 to decode the signal S1.

Compared to the prior art, the wobble clock generator of the claimed invention is capable of avoiding interference from a phase-modulated wobble clock by using a protective mechanism having two protection signals to ensure a stable wobble clock. Besides, the oscillating signal generated by the phase-locked loop circuit is utilized both to generate a wobble clock through a frequency-dividing process and to act as a reference clock for the operation circuit to generate the first protection signal. In other words, an extra clock generator for generating a reference clock to drive the counter is put aside compared to the prior art. Consequently, the circuit design of the wobble clock generator of the claimed invention is relatively simple and easy to implement, which means the wobble clock generator is a cost-effective circuit for any DVD+R disc drive or DVD+RW disc drive.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A clock generator for generating a non-phase-modulated target clock signal based on a phase-modulated input signal, the clock generator comprising:
   an operation circuit for calculating a cycle value by calculating the number of cycles of an oscillating signal during a cycle of the input signal and for comparing the cycle value with a critical value for outputting a first protection signal; and
   a phase-locked loop connected to the operation circuit for generating the target clock signal according to the first protection signal and the input signal, feeding the target clock signal back to the input of the phase-locked loop, and determining whether the target clock signal is to be synchronized with the input signal based on the logic level of the first protection signal;
   wherein the target clock signal is generated based on the oscillating signal, when the first protection signal corresponds to a first logic level, the phase-locked loop compares the target clock signal with the input signal to drive the target clock signal to be synchronized with the input signal, and when the first protection signal corresponds to a second logic level, the phase-locked loop holds the target clock signal without driving the target clock signal to be synchronized with the input signal.

2. The clock generator of claim 1, wherein the operation circuit comprises:
   a counter for calculating the cycle value by calculating a number of cycles of the oscillating signal during a cycle of the input signal; and
   a comparator connected to the counter for comparing the cycle value with a preset cycle value to generate a first protection signal.

3. The clock generator of claim 2, wherein the phase-locked loop comprises:
   a phase-frequency detector connected to the comparator for outputting a control signal by comparing the target clock signal with the input signal and for determining whether to compare the target clock signal with the input signal based on the logic level of the first protection signal;
   a loop filter connected to the phase-frequency detector for generating a control voltage based on the control signal; and
   a voltage-controlled oscillator connected to the loop filter for controlling the frequency of the target clock signal based on the control voltage.

4. The clock generator of claim 3, wherein the phase-locked loop further comprises:
   a frequency divider connected to the voltage-controlled oscillator for lowering the frequency of the oscillating signal to generate the target clock signal; and
   a second slicer connected to the frequency divider and the phase-frequency detector for slicing the target clock signal.

5. The clock generator of claim 3, wherein the clock generator further comprises:
   a band-pass filter for extracting the input signal having a frequency within a predetermined band; and
   a first slicer connected to the band-pass filter for slicing the input signal and forwarding the input signal to the counter of the operation circuit and the phase-frequency detector of the phase-locked loop.

6. The clock generator of claim 1, wherein when the difference between the cycle value and the preset cycle value is not larger than a critical value, the first protection signal is set to a first logic level.

7. The clock generator of claim 1, wherein when all the differences between a plurality of the consecutive cycle values and the preset cycle value are not larger than a critical value, the first protection signal is set to a first logic level.

8. The clock generator of claim 1, wherein when the difference between the cycle value and the preset cycle value is larger than a critical value, the first protection signal is set to a second logic level.

9. The clock generator of claim 1, wherein when all the differences between a plurality of the consecutive cycle values and the preset cycle value are larger than a critical value, the first protection signal is set to a second logic level.

10. The clock generator of claim 1 being applied to an optical drive, wherein the optical drive is a DVD-R optical drive or a DVD-RW optical drive, the optical drive comprising an ADIP decoder for predicting a timing for the input of the first period corresponding to the next ADIP unit of the input signal and generating a second protection signal to prohibit the phase-locked loop from driving the target clock signal to be synchronized with the input signal at a predetermined time before the timing of the input of the first period corresponding to the next ADIP unit of the input signal.

11. A clock generating method for generating a non-phase-modulated target clock signal based on a phased-modulated input signal,
   the clock generating method comprising:
   determining whether the target clock signal is to be synchronized with the input signal according to a first protection signal for generating a control signal;
   generating a control voltage based on the control signal; and
   controlling the frequency of the target clock signal according to the control voltage;
   wherein a cycle value is generated by calculating the number of cycles of an oscillating signal during a cycle of the input signal and the logic level of the first protection signal is determined by comparing the cycle value with a preset cycle value.

12. The clock generating method of claim 11, wherein the generating method further comprises:
receiving the input signal and the oscillating signal to calculate the number of cycles of an oscillating signal during a cycle of the input signal; and
generating a first protection signal by comparing the cycle value with a preset cycle value.

13. The clock generating method of claim 11, wherein when the first protection signal equals to a first logic level, the method further comprises comparing the target clock signal with the input signal for driving the target clock signal to be synchronized with the input signal, and when the first protection signal equals to a second logic level, the method further comprises holding the target clock signal without driving the target clock signal to be synchronized with the input signal.

14. The clock generating method of claim 13, wherein when the difference between the cycle value and the preset cycle value is not larger than a critical value, the first protection signal is set to a first logic level.

15. The clock generating method of claim 13, wherein when all the differences between a plurality of the consecutive cycle values and the preset cycle value are not larger than a critical value, the first protection signal is set to a first logic level.

16. The clock generating method of claim 13, wherein when the difference between the cycle value and the preset cycle value is larger than a critical value, the first protection signal is set to a second logic level.

17. The clock generating method of claim 13, wherein when all the differences between a plurality of the consecutive cycle values and the preset cycle value are larger than a critical value, the first protection signal is set to a second logic level.

18. The clock generating method of claim 11 being applied to an optical drive, wherein the optical drive is a DVD-R optical drive or a DVD-RW optical drive, the clock generating method further comprising predicting a timing for the input of the first period of the input signal and generating a second protection signal to hold the target clock signal without driving the target clock signal to be synchronized with the input signal at a predetermined time before the timing of the input of the first period of the input signal.

19. The clock generating method of claim 18 further comprising disabling the second protection signal when the prediction of the timing for the input of the first period of the input signal functions incorrectly.

* * * * *